United States Patent
Heinrichs et al.

(10) Patent No.: US 8,045,340 B2
(45) Date of Patent: Oct. 25, 2011

(54) DATA PROCESSING SYSTEM

(75) Inventors: Hans-Jürgen Heinrichs, Altenbeken (DE); Melanie Sell, Paderborn (DE)

(73) Assignee: Fujitsu Siemens Computers GmbH (DE)

( * ) Notice: Subject to any disclaimer, the term of this patent is extended or adjusted under 35 U.S.C. 154(b) by 421 days.

(21) Appl. No.: 12/330,410

(22) Filed: Dec. 8, 2008

(65) Prior Publication Data

US 2009/0147492 A1 Jun. 11, 2009

(30) Foreign Application Priority Data

Dec. 6, 2007 (DE) .......................... 10 2007 058 724

(51) Int. Cl.
*H05K 7/02* (2006.01)
*H05K 7/04* (2006.01)
(52) U.S. Cl. ....................... 361/810; 361/807
(58) Field of Classification Search .................. 361/807, 361/810, 730, 752, 796, 800; 312/223.1, 312/223.2
See application file for complete search history.

(56) References Cited

U.S. PATENT DOCUMENTS

| | | | | |
|---|---|---|---|---|
| 5,440,755 A * | 8/1995 | Harwer et al. | ................ | 710/315 |
| 5,765,008 A | 6/1998 | Desai et al. | .................. | 395/800 |
| 6,533,587 B1 * | 3/2003 | Potter et al. | .................... | 439/65 |
| 7,009,848 B2 * | 3/2006 | Ruckerbauer et al. | ........ | 361/785 |
| 7,280,373 B2 * | 10/2007 | Aizawa | .......................... | 361/803 |
| 7,440,293 B2 * | 10/2008 | Hood et al. | .................. | 361/810 |
| 7,639,507 B2 * | 12/2009 | Chen et al. | .................... | 361/756 |

FOREIGN PATENT DOCUMENTS

| | | |
|---|---|---|
| DE | 200 03 706 | 5/2000 |
| DE | 102 29 120 | 2/2004 |

OTHER PUBLICATIONS

German Examination Reported dated Jun. 6, 2008. (4 pgs).

* cited by examiner

*Primary Examiner* — Hung S Bui
(74) *Attorney, Agent, or Firm* — Hayes Soloway P.C.

(57) ABSTRACT

The invention relates to a data processing system with a main board, in which main board has at least one multipoint connector, in which at least one riser card is accommodated, and a first daughter card is accommodated in first riser card in such a manner that first daughter card is arranged parallel to main board. The data processing system further comprises a second multipoint connector, wherein a second riser card is accommodated in second multipoint connector, and a second daughter card is accommodated in second riser card in such a manner that second daughter card is arranged parallel to main board. The First multipoint connector and the second multipoint connectors are arranged on opposite outer sides of the main board. Each daughter card comprises a respective I/O interface which each cooperates with a common rear panel and is pointed towards the common rear panel. Relative to second daughter card, first daughter card is arranged rotated by 180° about an axis running parallel to main board.

8 Claims, 3 Drawing Sheets

DATA PROCESSING SYSTEM

BACKGROUND OF THE INVENTION

The invention relates to a data processing system with a main board, wherein the main board comprises at least one multipoint connector in which at least one riser card is accommodated and a first daughter card is accommodated in the first riser card in such a manner that the first daughter card is arranged parallel to the main board. The data processing system further comprises a second multipoint connector in which a second riser card is accommodated, wherein a second daughter card is accommodated in the riser card in such a manner that the second daughter card is arranged parallel to the main board.

Such data processing systems are used, for instance, in so-called blade servers. The peculiarity of the blade server is that several data processing systems of the type mentioned above are arranged one alongside another in a module carrier. The individual data processing systems are mounted in inserts and are inserted into the module carrier. The individual data processing systems are connected to one another via a common rear circuit board, also called a rear panel or midplane. Each of the data processing systems has interfaces formed that connect the data processing system to the common rear panel. The individual data processing systems are very shallow in construction and require only very little space. That is the origin of the term blade server, since each individual data processing system resembles a blade. In addition, the individual data processing systems are supplied by a common power supply and common ventilation with energy and cooling air. Thus, all data processing systems in the module carrier share a common energy and cooling air supply.

SUMMARY OF THE INVENTION

To achieve high variability between individual data processing systems, it should be possible for additional computer cards, referred to below as daughter cards, to be installed. To accomplish this, so-called riser cards are used, with which an arrangement of a daughter card parallel to the main board is possible in a space-saving manner.

A riser card is a computer expansion card for a data processing system that can be used to arrange one or more daughter cards spatially parallel to the main board in a data processing system. Riser cards are commercially available for different multipoint connectors. A distinction is made between passive and active riser cards, wherein the passive riser cards only electrically extend the contact terminals of the multipoint connectors. Active riser cards additionally have control electronics used for resource management of the daughter card connected to the riser card.

Because of the above-mentioned very shallow design of the individual data processing systems, even the arrangement of a second daughter card in a data processing system is burdened with problems.

It is accordingly the problem of the invention to allow the arrangement of a second daughter card cost-effectively in the data processing system.

This problem is solved in that the first multipoint connector and the second multipoint connector are arranged on the opposite outer sides of the main board (200), each daughter card comprises a respective I/O interface, the I/O interfaces of the daughter cards each cooperate with a common rear panel board and are pointed towards the common rear panel board, and the first daughter card is arranged rotated 180° relative to the second daughter card about a virtual axis running parallel to the main board.

The invention makes it possible for two daughter cards of identical form and function to be used in one and the same data processing system.

These two daughter cards of identical form and function, which can be used, for instance, for forming two I/O interfaces of identical form and function, can be integrated in this matter into the above-described data processing system, since the spatial situation in the insert is optimally utilized. Having to provide an additional multipoint connector for the arrangement of daughter cards next to one another in the middle of the main board is thereby advantageously avoided. This would be possible only with very large expense, due to the dense printed conductor structure on the main board.

Therefore production costs can be saved with the invention, since only one type need be produced and stocked for a given daughter card.

An additional advantageous achievement is that variability of the available I/O interfaces for data processing system is enhanced with the additional daughter card. According to the principle of the present invention, two daughter cards providing I/O interfaces such as fiber-optic interfaces, Ethernet interfaces or Infinband interfaces can be used in one data processing system.

As an additional advantage, the measures of the invention allow high data transmission rates, since high data transmission rates require the direct formation of the I/O interface on the daughter card provided according to the invention, whereby an optimally short path for the data signals is formed. Thus, transmission errors are avoided that could arise if the data signals are routed from the daughter card to the main board and from there to the I/O interface.

With the measures described, an additional problem is advantageously avoided. This relates to the conduction of cooling air in the data processing system. The conduction of cooling air in the data processing system is not hindered by the arrangement of the first multipoint connector and the second multipoint connector on opposite outer sides of the main board.

Accordingly, it is provided according to an advantageous refinement that the daughter card has a multipoint connector with which a riser card is accommodated, and the daughter card additionally has a circuit-board leadthrough that is surrounded by the multipoint connector. The riser card is accommodated in the circuit-board leadthrough. Thus the riser card is pushed through the daughter card.

According to an advantageous refinement, the daughter card can be moved along a predeterminable height of the riser card. The riser card additionally has printed conductors along which electrical contact springs of the multipoint connector can slide. It is thus possible to couple one and the same daughter card to the first plug-in card strip by means of the first riser card as well as to couple it to the second plug-in card strip with the second riser card, which is arranged on the opposite outer side on the second plug-in card strip. Thus, two daughter cards identical in construction and function can be connected both to the first multipoint connector and to the second multipoint connector. In the installed state, the two daughter cards are connected to one another as if they were simply folded around an axis running parallel to the main board.

Another advantageous refinement of the above-described principle provides that a first multipoint connector and a second multipoint connector be provided on the first and the second riser card, respectively. This first or second respective multipoint connector is arranged opposite the side of the riser card with which the riser card is introduced into the first or second multipoint connector of the main board. With its first multipoint connector, the first riser card thus forms a receptacle for arranging the first daughter card and for contacting the first daughter card with the first plug connector of the of the data processing system's main board. With the second multipoint connector for accommodating the second daughter card, the second riser card analogously forms an electrical coupling of the first daughter card to the second multipoint connector of the data processing system's main board.

BRIEF DESCRIPTION OF THE DRAWINGS

The invention will be described in detail below by means of six figures and with reference to two embodiments.
Therein.

DETAILED DESCRIPTION OF THE INVENTION

Figure 1:
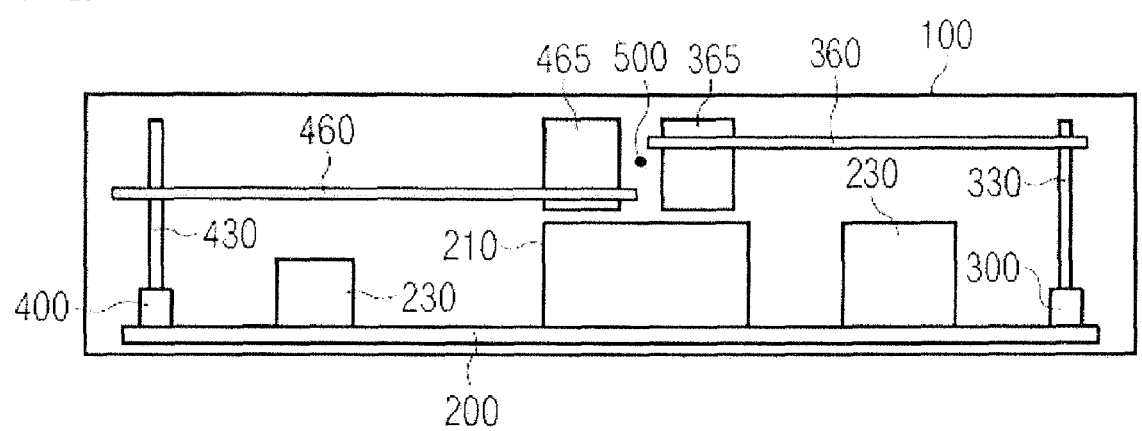
FIG. 1 shows a schematic representation of a data processing system.

The schematic representation of FIG. 1 shows a data processing system 100 and with a main board 200 on which at least one I/O interface 210 is arranged. The main board of data processing system 100 further comprises a main processor 220 and a RAM working memory 230. RAM means random-access memory and thus describes an electronic memory with selective access, which is used as working memory 230 in data processing system 100. These components are each arranged directly or indirectly on main board 200. FIG. 1 further shows a first multipoint connector 300 into which a first riser card 330 is inserted. A first daughter card 360, which in turn comprises an I/O interface 365, is coupled to first riser card 330. First daughter card 360 is coupled by first riser card 330 to first multipoint connector 300.

Data processing system 100 additionally has a second multipoint connector 400 which is arranged on an outer side of main board 200 of data processing system 100 that is opposite first multipoint connector 300. A riser card 430 is accommodated in second multipoint connector 400. A second daughter card 460 is coupled to the riser card. By way of this arrangement, second daughter card 460 is arranged in data processing system 100 as if it were reflected from the first daughter card 360 according to an axial mirroring on a mirror axis 500.

The schematic representation of FIG. 1 shows data processing system 100 from a common rear panel 600, not shown in this figure. Common rear panel 600 is arranged in the perpendicular direction with respect to mirror axis 500. Data processing system 100 is arranged in a housing that can be inserted into an installation rack. The housing and the installation rack are not represented. A plurality of such data processing systems 100 in an installation rack forms a blade server system.

First and second riser cards 330, 430 thus form in essence the electrical contacts between daughter cards 360, 460 and main board 200. They consequently transmit electrical signals from main board 200 to the respective daughter card 360, 460. Mechanical devices such as screws and spacer sleeves can be provided for mounting the respective daughter card 360, 460 and or mechanical fixation of the position of daughter card 360, 460 in data processing system 100.

The riser card 330, 430 is constructed to accommodate a respective daughter card 360, 460 in such a manner that the daughter card is arranged spatially parallel to main board 200. Each daughter card 360, 460 comprises an I/O interface 365, 465. In the embodiment, daughter cards 360 and 460 are identical in form and function. The mirror axis 500, which is not a mechanical element of the entire arrangement but rather a virtual mirror axis, has been adopted to illustrate an arrangement principle. The daughter cards are arranged in a data processing system as if they mirrored one another at mirror axis 500. That is to say, second daughter card 460 corresponds to an axial mirror image of first daughter card 360 at mirror axis 500. The two daughter cards 360 in 460 are consequently arranged according to an axial mirror image. An axial mirror image is a mirror image through a straight line. To each point P, axial mirror imaging assigns an image point P', which is determined in that the connection line P-P' is vertically bisected by the axis. The fixed points of an axial mirror image are the points of the mirror axis. In three-dimensional space, axial mirror imaging corresponds to a 180° rotation of a body about the mirror axis. An object that lies in a plane with the mirror axis is therefore folded over into the same plane.

Applied to the embodiment of FIG. 1, this means that two daughter cards of identical form and function are inserted into the data processing system and thus allow two I/O interfaces of identical form and function, which are pointed towards the common rear panel.

Figure 2:
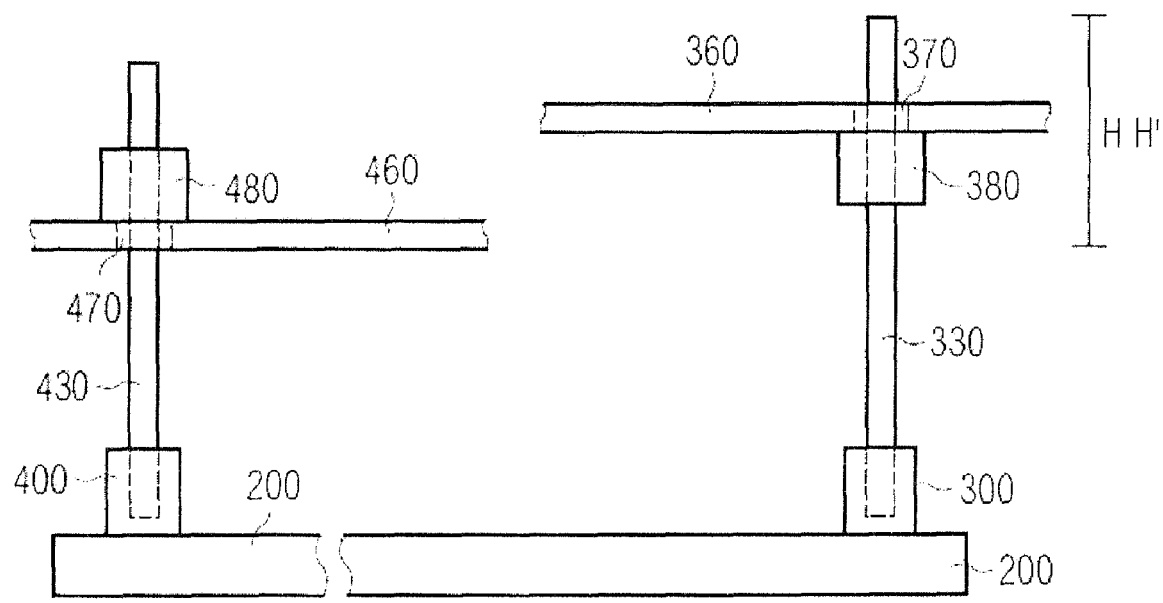
FIG. 2 depicts a first embodiment.

In a cutout representation, FIG. 2 shows an embodiment for the contacting of first daughter card 360 to main board 200 of data processing system 100. In this embodiment, the contacting is formed by accommodating first riser card 330 in first multipoint connector 300. First daughter card 360 comprises a first circuit-board leadthrough 370. First circuit-board leadthrough 370 is surrounded by a first multipoint connector 380 of first daughter card 360. First circuit-board leadthrough 370 is adapted to the shape and size of first riser card 330, so that first riser card 330 can be inserted into first circuit-board leadthrough 370. For creating a contact of main board 200 to first daughter card 360, first riser card 330 is introduced into first multipoint connector 300 on main board 200. First riser card 330 is then arranged vertically with respect to the plane of main board 200. First daughter card 360 is coupled to first riser card 330 by introducing first riser card 330 into first circuit-board leadthrough 370. This yields an arrangement of first daughter card 360 parallel to main board 200. First riser card 330 is designed such that the contacts of first riser card 330 are constructed in the form of several parallel contact strips on a predeterminable path H. Thus, first daughter card 360 can be arranged on first riser card 330 at different height levels without causing interruptions of the contacts.

The electrical contacts of first riser card 330 to first daughter card 360 are consequently formed by the first multipoint connector 380 of daughter card 360. First multipoint connector 300 and multipoint connector 380 of first daughter card 360 are connected by solder joints to the respective printed conductors of main board 200, and first daughter card 360.

The representation of the embodiment in FIG. 2 further comprises the arrangement of the second daughter card 460. The arrangement of second daughter card 460 corresponds to the above-mentioned principle of axial mirror imaging on axis 500 as a consequence of first daughter card 360 being mirrored about axis 500. Second daughter card 460 is identical in construction and function to first daughter card 360.

Second daughter card 460 comprises a second circuit-board leadthrough 470 which is constructed to accommodate second riser card 430. Second circuit-board leadthrough 470 is surrounded by a second multipoint connector 480 of the second daughter card. Second riser card 430 is inserted into second multipoint connector 400, which is arranged on main board 200 opposite first multipoint connector 300. With second multipoint connector 480, second circuit-board leadthrough 470 accommodates the riser card 430 inserted into second circuit-board leadthrough 470. Electrical contacts are formed by second multipoint connector 480. For this purpose, second riser card 430 has longitudinally oriented parallel printed conductors on its surface that cooperate with the electrical contacts of second multipoint connector 480. Just like riser card 330, riser card 430 is furnished with these printed conductor strips over a predetermined path H'. These allow an exact adjustment of daughter card 460 over the entire path length H'.

Figure 3:
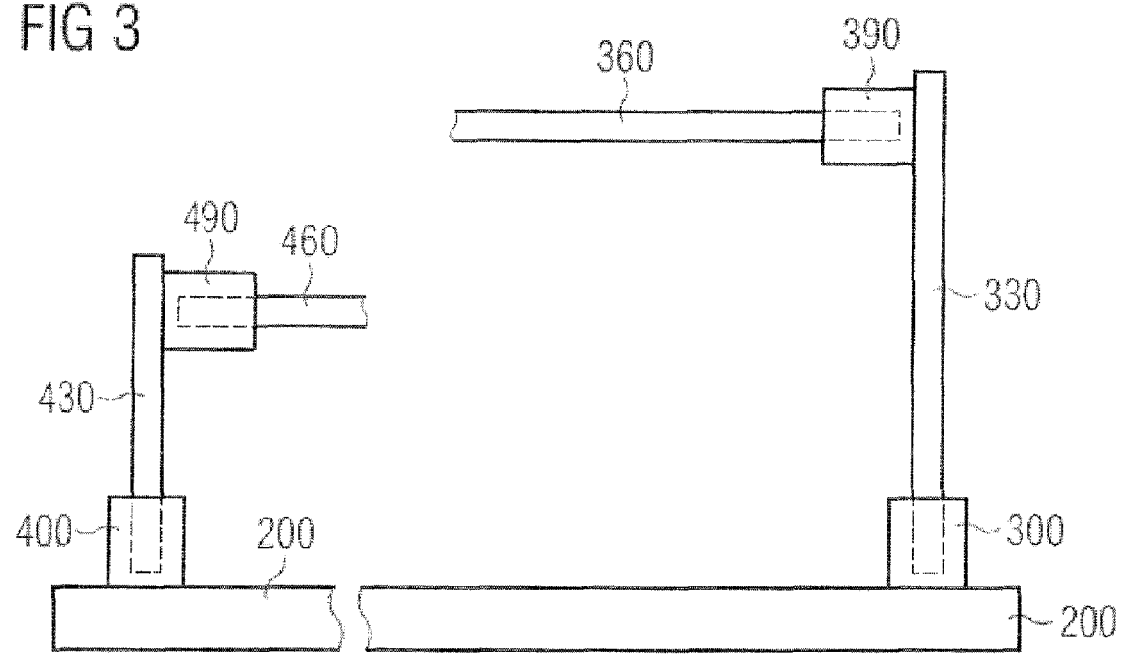
FIG. 3 depicts a second embodiment.

FIG. 3 shows sections of data processing system 100, wherein the arrangement of daughter cards 360, 460, particularly the formation of the electrical contacts between main board 200 and daughter cards 360, 460, is formed according to a second embodiment. This embodiment is distinguished, among other things, by the use of a first riser card 330 and a second riser card 430. First riser card 330 comprises a multipoint connector 390 for accommodating first daughter card 360. Opposite multipoint connector 390, first riser card 330 has contacts with which it is introduced into first multipoint connector 300 of main board 200. Second riser card 430, which differs in height from first riser card 330, is provided for positioning second daughter card 460. Second riser card 430 has a multipoint connector 490. It is arranged on an exterior side of second riser card 430. On the opposite end from this exterior side, the second riser card has contacts with which it is introduced into first multipoint connector 400 of main board 200. The different height or different design of second riser card 430 relative to first riser card 330 makes it possible to arrange daughter cards 360 and 460 according to the axial mirror imaging, and thus to orient the I/O interfaces 365 and 465 arranged on the daughter card such that they are arranged in alignment with one another at an identical height.

Figure 4:
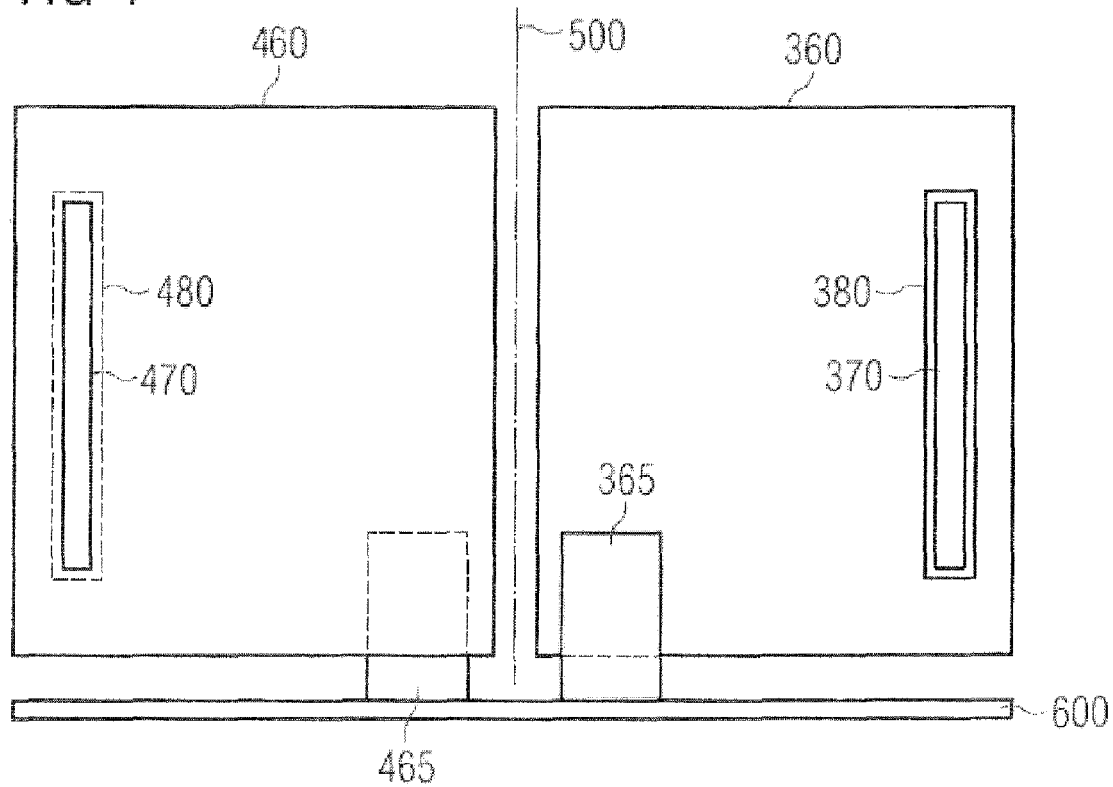
FIG. 4 shows the arrangement of two identical daughter cards according to the first embodiment, in a plan view.

In a plan view, FIG. 4 shows the two daughter cards 360 and 460, which are arranged according to axial mirror imaging on mirror axis 500. Daughter cards 360 and 460 in FIG. 4 correspond to the embodiment of FIG. 3. First daughter card 360 of this embodiment comprises first circuit-board leadthrough 370, and second daughter card 460 of this embodiment comprises second circuit-board leadthrough 470. In both daughter cards 360 and 460, circuit-board leadthroughs 370 and 470 are surrounded by first multipoint connector 380 or second multipoint connector 480, respectively. First and second daughter card 360 and 460 each comprise an I/O interface 365 and 465, respectively. First I/O interface 365 and second I/O interface 465 are arranged in data processing system 100 such that both are pointed towards the common rear panel 600. Common rear panel 600 forms a common interface board for this data processing system 100 and for all data processing systems inserted into the above-mentioned installation rack.

Figure 5:
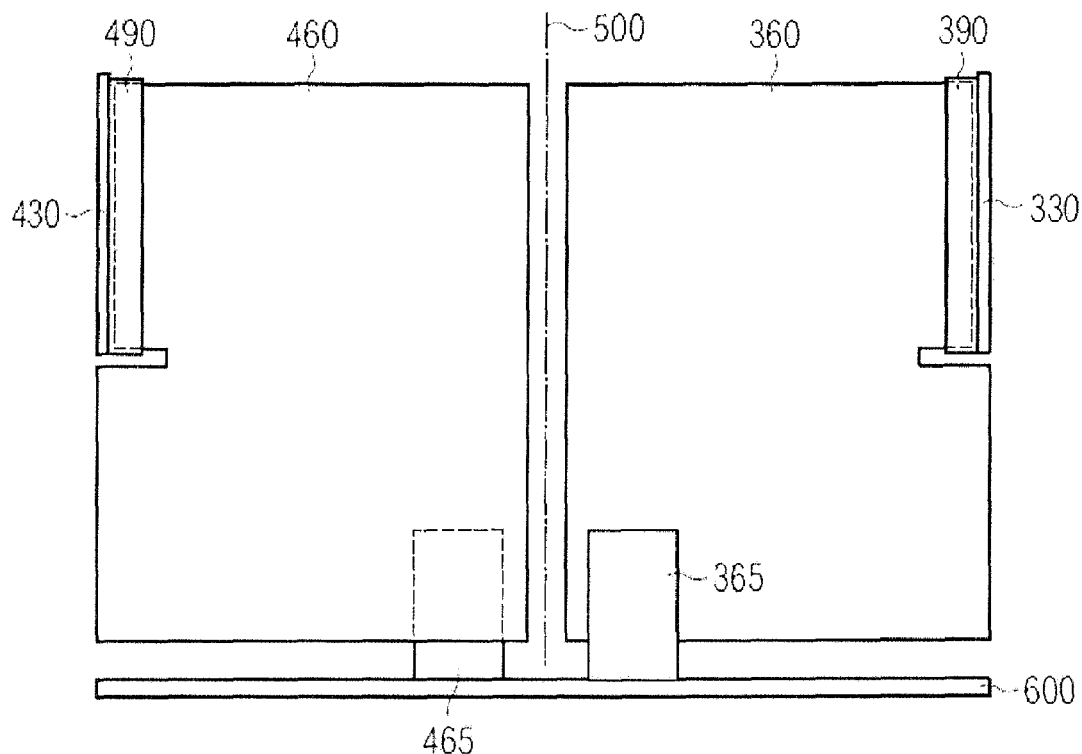
FIG. 5 shows the arrangement of two identical daughter cards according to the second embodiment, in a plan view.

In a plan view, FIG. 5 shows first daughter card 360 and second daughter card 460 in the arrangement according to the first embodiment from FIG. 3 according to the axial mirror imaging on mirror axis 500. The formation of electrical contacts is accordingly constituted as in the embodiment known from FIG. 3. First daughter card 360 and second daughter card 460 are arranged identically in construction and function in data processing system 100. First riser card 330 comprises first multipoint connector 390, and second riser card 430 comprises second multipoint connector 490. A respective daughter card 360 or 460 is accommodated in these multipoint connectors 390 and 490.

Figure 6:
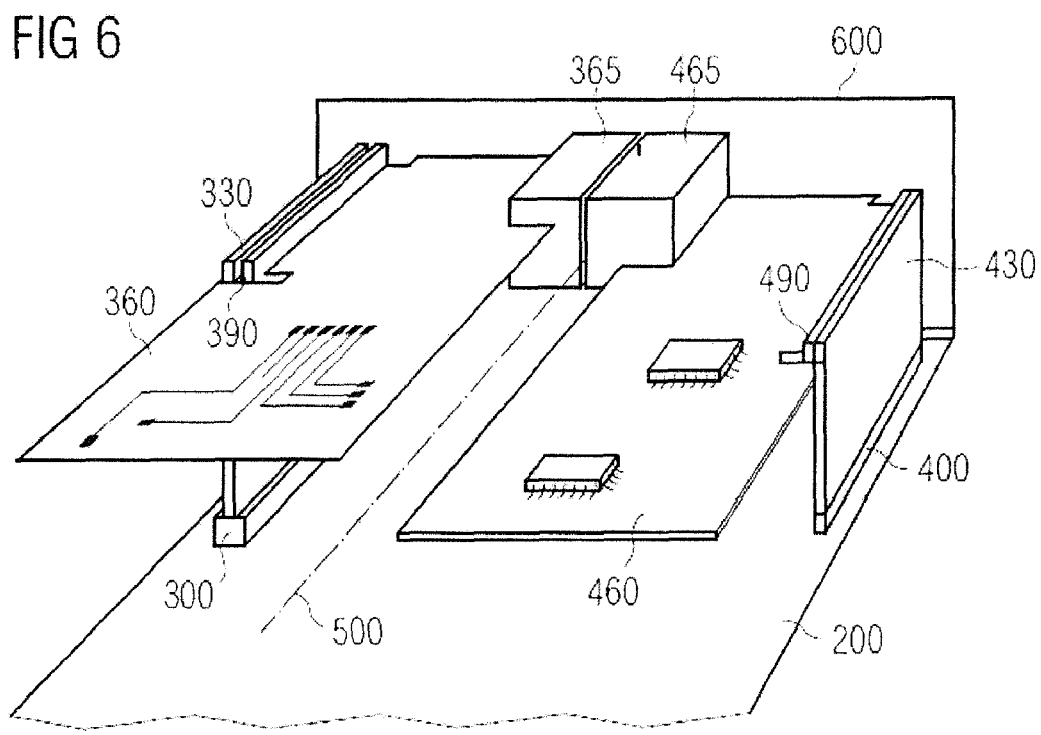
FIG. 6 shows the arrangement of two identical daughter cards according to the second embodiment, in a perspective view.

FIG. 6 shows a perspective representation of data processing system 100 according to the embodiment from FIG. 5 and FIG. 3. First daughter card 360 is directed upward with a side that has the printed conductors and is accommodated in first multipoint connector 390 of first riser card 330. First riser card 330 is accommodated in first multipoint connector 300 of main board 200. Second daughter card 460 is arranged with respect to first daughter card 360 as if it were mirrored on mirror axis 500. By way of riser cards 330 and 430 with different shapes, I/O interfaces 365 and 465 are arranged in data processing system 100 such that the I/O interfaces are aligned on a common plane. The surface of the first daughter card 360 that is directed to the main board is directed upward in daughter card 460 of identical construction and function. Second daughter card 460 appears to be folded around axis 500 with respect to daughter card 360. The I/O interfaces 365 and 465 form electrical contacts with the common rear panel 600. Common rear panel 600 forms a common interface platform for all data processing systems in a module carrier.

It holds for all embodiments that the daughter cards alone with the multipoint connectors and the thereby formed mechanical connections, are not sufficiently fixed mechanically in the data processing system. It is consequently advantageous to provide an additional mechanical fixation in order to hold the daughter cards in place in the data processing system and thus assure malfunction-free electrical contacts at the contact points of the multipoint connectors even for long periods of time.

LIST OF REFERENCE NUMBERS

100 Data Processing System
200 Main board
210 I/O interface (main board)
220 Main processor
230 RAM memory
300 First multipoint connector (main board)
330 First riser card
360 First daughter card
365 I/O interface (first daughter card)
370 Circuit-board leadthrough (first daughter card)
380 Multipoint connector (first daughter card)
390 Multipoint connector (first riser card)
400 Second multipoint connector (main board)
430 Second riser card
460 Second daughter card
465 I/O interface (second daughter card)
470 Circuit-board leadthrough (second daughter card)
480 Multipoint connector (second daughter card)
490 Multipoint connector (second riser card)
500 Mirror axis
600 Common rear panel
H Path length (first riser card)
H' Path length (second riser card)

The invention claimed is:
1. A data processing system having a main board, said main board comprising:
a first multipoint connector, wherein a first riser card is accommodated in the first multipoint connector, and a first daughter card is accommodated in the first riser card such that the first daughter card is arranged parallel to the main board;

and a second multipoint connector, wherein a second riser card is accommodated in the second multipoint connector, and a second daughter card is accommodated in the second riser card such that the second daughter card is arranged parallel to the main board, wherein the first multipoint connector and the second multipoint connector are arranged on respective opposite outer sides of the main board, wherein each daughter card has a respective I/O interface, wherein the I/O interfaces of the first and second daughter cards, respectively, cooperate with a common rear panel and are pointed towards the common rear panel, and wherein relative to the second daughter card, and the first daughter card is arranged rotated 180° about an axis running parallel to the main board.

2. The data processing system according to claim 1, wherein:

the first daughter card and the second daughter card are identical in form and function.

3. The data processing system according to claim 1, wherein the first riser card and the second riser card each have a riser card multipoint connector, constructed to accommodate the first and second daughter cards, respectively.

4. The data processing system according to claim 1, wherein:

each of the first and second daughter cards has a daughter card multipoint connector which is constructed to accommodate one of the first and second riser cards.

5. The data processing system according to claim 4, wherein:

each of the first and second daughter cards has a circuit-board leadthrough which is surrounded by the respective daughter card multipoint connector.

6. The data processing system according to claim 1, wherein:

the main board has at least one I/O interface and at least one main processor.

7. The data processing system according to claim 1, wherein a RAM working memory can be arranged on main board.

8. A modularly constructed server system, comprising a plurality of data processing systems according to claim 1, wherein each of the plurality of data processing systems is constructed as an insert that is accommodated in an installation rack.

* * * * *